US007715899B2

(12) United States Patent
Harvey et al.

(10) Patent No.: US 7,715,899 B2
(45) Date of Patent: May 11, 2010

(54) ALL IN ONE PLAN SCAN IMAGING FOR OPTIMIZATION OF ACQUISITION PARAMETERS

(75) Inventors: Paul Royston Harvey, Eindhoven (NL); Luc Richard Kruger, Eindhoven (NL); Sander Slegt, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 893 days.

(21) Appl. No.: 10/598,420

(22) PCT Filed: Feb. 24, 2005

(86) PCT No.: PCT/IB2005/050681

§ 371 (c)(1),
(2), (4) Date: Aug. 29, 2006

(87) PCT Pub. No.: WO2005/088328

PCT Pub. Date: Sep. 22, 2005

(65) Prior Publication Data

US 2007/0276220 A1    Nov. 29, 2007

(30) Foreign Application Priority Data

Mar. 1, 2004    (EP) .................................. 04100799

(51) Int. Cl.
*A61B 5/05* (2006.01)
*G01V 3/00* (2006.01)
(52) U.S. Cl. ...................................... 600/410; 324/309
(58) Field of Classification Search ................ 600/410; 324/307, 309
See application file for complete search history.

(56) References Cited

U.S. PATENT DOCUMENTS

| 5,311,131 | A | 5/1994 | Smith |
| 5,758,646 | A | 6/1998 | Van der Meulen et al. |
| 6,108,573 | A | 8/2000 | Debbins et al. |
| 6,484,048 | B1 | 11/2002 | Hoshino et al. |
| 6,725,077 | B1 * | 4/2004 | Balloni et al. ............... 600/410 |
| 6,963,768 | B2 * | 11/2005 | Ho et al. ..................... 600/415 |
| 2002/0173715 | A1 | 11/2002 | Kruger et al. |
| 2003/0011369 | A1 | 1/2003 | Brittain et al. |

FOREIGN PATENT DOCUMENTS

| EP | 1 220 153 A2 | 7/2002 |
| EP | 1 221 623 A2 | 7/2002 |
| EP | 1 362 550 A1 | 11/2003 |

* cited by examiner

*Primary Examiner*—Eric F Winakur
*Assistant Examiner*—Michael T Rozanski

(57) ABSTRACT

The present invention provides a magnetic resonance imaging system making use of low resolution, whole-body plan scan image of a body. The whole-body plan scan image is exploited to gather a plurality of individual information of a body that is essential for an optimization of acquisition parameter for acquisition of a high resolution and high quality image of a region of interest of the body. Moreover, the whole-body plan scan image is used in order to facility a determination and a selection of a region of interest to be performed by an operator. Additionally, the MRI provides effective means for autonomously identifying specific body parts or even organs of a patient. Providing the entire information that can be extracted from the whole-body plan scan image to the operator effectively simplifies the workflow of the operator in an intuitive way. Preferably, during acquisition of the low resolution whole-body plan scan image, necessary calibration parameters for acquisition of the final high resolution image are obtained.

17 Claims, 6 Drawing Sheets

ALL IN ONE PLAN SCAN IMAGING FOR OPTIMIZATION OF ACQUISITION PARAMETERS

FIELD OF THE INVENTION

The present invention relates to the field of magnetic resonance imaging systems.

BACKGROUND AND PRIOR ART

Improving the image quality of a magnetic resonance imaging system, i.e. improving signal to noise ratio (SNR) and resolution of images, can in principle be achieved by increasing the magnitude of the static magnetic field as well as realizing a faster gradient switching. In order to enhance the SNR, magnetic resonance imaging (MRI) systems using a high static magnetic field have been developed. However, as the strength of the static magnetic field increases, the frequency of the RF transmitting field linearly increases as well.

Increasing the static magnetic field for example from 1.5T to 3T results in a RF transmitting field whose interaction with a human body can no longer be neglected. Interaction between the RF transmitting field and the human body is observed by, for example, the dielectric resonance effect, since the effective wavelength of the RF transmitting field is comparable to or even smaller than the dimension of the human body that is subject to imaging by the MRI system.

Such a strong interaction not only degrades substantially the RF transmitting field homogeneity and thus the imaging quality, but also can cause concerns about the safety because the electric field associated with the RF transmitting magnetic field increases with the inhomogeneity of the RF transmitting field. In the regime of high magnetic fields, the limits of specific absorption rate (SAR), peripheral nerve stimulation (PNS) and acoustic noise may easily be reached.

In order to produce high resolution and high signal to noise ratio images by making use of high magnetic fields, a MRI system has to operate much closer to the limits of SAR, PNS and acoustic noise compared to an imaging system operating in the regime of lower magnetic field strength.

Consequently, more sophisticated SAR and PNS models, hardware calibration, safety features and patient dependent optimizations are required. As a result, the necessity for pre-scan calibrations appreciably increases. When for example a plurality of specific calibrations has to be performed sequentially, the percentage of time spent calibrating versus clinical scanning time would become too high. Consequently scanning sessions dramatically expand in time and increase in complexity for the patient and the operator alike.

The European patent application EPI 220 153 A2 discloses a method and apparatus for providing a "just-in-time" localizer image of an object of interest from which a high resolution image can be based. This method includes prescribing a second image relative to at least one of a default second image, a first image and a representation of a three dimensional volume data set. The method further includes acquiring the second image, displaying the second image, and prescribing a clinically useful image relative to the second image. The second image and the clinically useful image are prescribed, acquired, and displayed within a single graphical prescription environment included in an imaging system.

In particular, the method and apparatus disclosed in EP 1 220 153 A2 makes use of localizer images that permit a region of interest of a subject being imaged to be visualized relatively quickly, such that the operator may get orientated within the three dimensional space of the patient and/or to locate the desired region of interest within the patient to be further imaged. The localizer images also provide a reference frame or image from which location, orientation, and other imaging parameters associated with one or more target images to be subsequently acquired can be prescribed.

EP 1 220 153 A2 mainly focuses on searching or maneuvering of a scan plane within the subject of interest to find a specific region desired to be imaged. This is primarily performed by using precursor images rather than by using localizer images and/or target images. The method and apparatus disclosed therein does not focus on the general enhancement of the quality of high resolution images obtained by an MRI system.

The present invention therefore aims to provide an MRI system, a computer program product and a method for improving the imaging quality of an MRI system as well as facilitating a selection of a region of interest of a body being subject to magnetic resonance imaging.

SUMMARY OF THE INVENTION

The present invention provides a MRI system for acquiring a high resolution image of a region of interest of a body. The MRI system comprises means for acquiring a low resolution whole-body plan scan image of the body, means for identifying the region of interest of the body, means for determining acquisition parameters for the high resolution image on the basis of the whole-body plan scan image, and means for acquisition of the high resolution image of the region of interest by making use of the determined acquisition parameters.

The low resolution whole-body plan scan image of the body is preferably acquired in the regime of low magnetic gradient fields, slowly varying gradient fields and low RF transmitting field strength. The whole-body plan scan image, also denoted as scout image, is preferably obtained by making use of a rapid imaging technique, such as the fast field echo (FFE) technique. Such a rapid imaging technique is used to make a three dimensional scan, i.e. a two dimensional multi-slice scan, of a patient in a relatively short time that may for example not exceed one minute. Notably, the whole-body plan scan image concerns an image of the patient from the top of the head to the bottom of the feet. Then an accurate estimate of the total mass of the patent can be made from the whole-body plan scan image. To further enable correct setting of PNS (peripheral nerve stimulation) limits, the whole-body plan scan image should show the boundaries for the body. Such a scout image can be preferably obtained using continuous table movement or stepped bed movement and does not require either a high SAR or rapid switching of the gradient magnetic field.

According to a further preferred embodiment of the invention, the MRI system further comprises a graphical user interface (GUI) allowing an operator to select a region of interest in the whole-body plan scan image. The whole-body plan scan image, or scout image is visualized by the graphical user interface providing a three dimensional view of the entire body that is subject to magnetic resonance imaging. The three dimensional visualization of the scout image can be generally realized in a multitude of different ways, by e.g. displaying a multitude of different two dimensional slices or even by a single three dimensional representation of the entire scout image.

In accordance with a further preferred embodiment of the invention the whole-body plan scan image is analyzed by means of a pattern recognition procedure. The pattern recognition procedure detects potential regions of interest such as organs. For this purpose the pattern recognition procedure may use a body model. The body model is correlated with the acquired whole-body plan scan image data for locating organs in the image. The result of the pattern recognition procedure can be provided by displaying of labels in the image or by means of a selection window. For example, the selection window is a pull down menu from which an operator can select an organ. Alternatively the operator can select a region of interest by clicking on one of the labels. Next a high resolution scan of the selected region of interest is performed.

Typically, the operator is supplied with a plurality of image manipulation tools providing translation, rotation, magnification, re-scaling, etc. of the illustrated scout image. Furthermore, the operator has the possibility to specify and to select a region of interest within the displayed scout image that becomes subject to an optimized high resolution imaging. Displaying the entire scout image by means of the GUI therefore not only represents possible means for identifying the region of interest of the body but also provides an easier, intuitive and efficient workflow for the operator. Identification and selection of the region of interest can effectively be realized with a reduced number of actions, e.g. mouse clicks, that have to be executed by the operator.

According to a further preferred embodiment of the invention, the means for acquisition of the high resolution image are further adapted to move the region of interest of the body to a region of optimum performance of the magnetic resonance imaging system. By acquiring the low resolution scout image of the body, the MRI system obtains precise information of the location of the patient with respect to the RF transmitting coil, the gradient coil system and the main magnet system of the MRI system. Having knowledge about this relative position, a region of interest selected by an operator can effectively be assigned to an absolute position or to a relative position of the designated region of interest.

The relative position of the region of interest can for example be related to any one or several of the magnetic coils of the MRI system. The knowledge of the absolute or relative position of the region of interest can then further be exploited in order to move the patient in such a way, that the selected region of interest of the body is moved to the region of optimum performance of the MRI system. In this way there is no longer a need for a manual positioning of the patient that for example makes use of a laser marker. In essence, proper positioning and alignment of the patient can exclusively be performed on the basis of the acquired scout image.

According to a further preferred embodiment of the invention, the means for identifying the region of interest of the body are further adapted to extract body positioning parameters from the whole-body plan scan image. These body positioning parameters are for example indicative of the anatomy, the specific geometry, the orientation as well as of the mass of the body inside the MRI system. Hence the system is principally enabled to extract any kind of geometrical data from the scout image.

For example by use of an average tissue/fat/bone density of a body, even the total mass of a patient can precisely be determined by accumulating the volume of all pixels in the three dimensional whole-body scout image. Additionally, the obtained geometric data can for example further be exploited in order to determine the gender of the patient and/or to determine whether the patient is an adult or a child. Additionally, the data which is gathered from the scout image is essential for the specification and optimization of acquisition parameters for the acquisition of the high resolution image of the region of interest.

According to a further preferred embodiment of the invention, the means for identifying the region of interest of the body are further adapted to perform an assignment between the region of interest and a part of the body. Having knowledge of the size of the body, the position of the body as well as the location of the region of interest allows to assign the region of interest to a body part by comparing the gathered data with reference data that is stored in the system.

For example, when a region of interest overlaps with the end position of the body and when the MRI system has knowledge of the orientation of the body, it can easily determined, whether the region of interest corresponds to the head or to the feet of a patient. Preferably, the reference data also provides precise information of e.g. the location of specific extremities, the torso, the hips, etc. relative to the head or to the feet of a patient. By maximum exploitation of reference data, the inventive MRI system unequivocally assigns an arbitrary region of interest selected by an operator to a distinct part of a body.

According to a further preferred embodiment of the invention, the acquisition parameters for acquiring the high resolution image of the region of interest are determined with respect to the body positioning parameters and the assignment between a region of interest and a part of the body. The acquisition parameters specify the strength of the applied magnetic fields as well as the switching frequency of the gradient magnetic fields. In this way, optimized magnitudes of the applied fields that are just below the limits defined by SAR and PNS models can effectively be determined. Since the limits for e.g. RF power deposition varies for different body parts, the RF power as well as the magnetic field strength can individually be adapted for a specific body part that is in the region of interest and that is further in the plane of acquisition of the MRI system.

According to a further preferred embodiment of the invention, the acquisition means are further adapted to dynamically determine the acquisition parameters with respect to the body positioning parameters and with respect to the body part that is in the region of optimum performance of the MRI system. When for example the region of interest is relatively large and thus expands over multiple different body parts or even the entire body, the acquisition parameters can be dynamically modified during the acquisition of the high resolution image of the region of interest.

According to a further preferred embodiment of the invention, the acquisition parameters are subject to optimization with respect to a specific absorption rate (SAR) model and/or peripheral nerve stimulation (PNS) model. Making use of refined SAR and/or PNS models allows to specify and to determine the optimal strength of applied magnetic fields as well as to determine an optimal slew rate of the rapidly switching gradient field. For such an optimization, knowledge of the size, the location, the orientation and the mass of a patient is essential. The acquisition of a whole-body plan scan image as well as the extraction of relevant patient information from the whole-body plan scan image is extremely advantageous for the purpose of determining and applying individually optimized parameters for the acquisition of a high resolution image with a high SNR.

According to a further preferred embodiment of the invention, the system further comprises pattern recognition means for autonomously identifying parts of the body on the basis of the whole-body plan scan image. For example by correlating different slices of the whole-body plan scan image and comparing the different slices as well as the correlation output with reference data, allows to identify and localize specific body parts as well as specific organs of the body. In this way, the system can autonomously determine the position of e.g. the heart or the lung relative to the head of the body or even the absolute position of these organs.

Identified body parts or organs can furthermore be illustrated as labels within the graphical visualization of the whole-body plan scan image. The operator's task then reduces to a selection of a distinct organ that has been recognized on the basis of the whole-body plan scan image. In essence the operator no longer has to iteratively and manually find and to determine a specific region of interest.

Furthermore, the scout image can be used to perform a calibration of the entire MRI system. The low resolution scout image can be obtained using both the body transmit coil (QBC) and local receive coils simultaneously. This allows a simultaneous determination of the position of the local receiving RF coil relative to the patient body, patient table and/or QBC.

In another aspect, the present invention provides a computer program product for a magnetic resonance imaging system for acquiring a high resolution image of a region of interest of a body. The computer program product comprises program means for: acquiring a low resolution whole-body plan scan image of the body, identifying the region of interest of the body, determining acquisition parameters for the high resolution image on the basis of the whole-body plan scan image and acquiring the high resolution image of the region of interest by making use of the determined acquisition parameters.

In accordance with a preferred embodiment of the invention the computer program product has program means adapted to extract body positioning parameters from the whole-body plan scan image, the body positioning parameters being indicative of the anatomy, the geometry, the orientation and the mass of the body.

In accordance with a preferred embodiment of the invention the computer program product has program means adapted to perform an assignment between the region of interest and a part of the body.

In accordance with a preferred embodiment of the invention the computer program product has program means adapted to determine the acquisition parameters with respect to the body positioning parameters and the assignment between the region of interest and a part of the body.

In accordance with a preferred embodiment of the invention the computer program product has program means adapted to dynamically determine the acquisition parameters with respect to the body positioning parameters and with respect to the body part being in the region of optimum performance of the magnetic resonance imaging system.

In accordance with a preferred embodiment of the invention the computer program product has program means adapted to perform an optimization of the acquisition parameters with respect to a specific absorption rate model and/or peripheral nerve stimulation model.

In accordance with a preferred embodiment of the invention the computer program product has program means for pattern recognition for autonomously identifying parts of the body on the basis of the whole-body plan scan image.

In still another aspect, the invention provides a method for acquiring a high resolution image of a region of interest of a body by making use of a magnetic resonance imaging system. The method comprises the steps of: acquiring a low resolution whole-body plan scan image of the body, identifying the region of interest of the body, determining acquisition parameters for the high resolution image on the basis of the whole-body plan scan image, and acquiring of the high resolution image of the region of interest by making use of the determined acquisition parameters.

The present invention provides an effective approach to generate high resolution images of a region of interest with an MRI system. The high resolution images featuring a high SNR are obtained by making use of a low resolution whole-body plan scan being exploited in order to determine individual patient information that is essential for an optimization of acquisition parameters for the acquisition of the high resolution image. Moreover, the whole-body plan scan is graphically visualized to an operator providing an easy and intuitive selection of a region of interest. Additionally, the whole-body plan scan image can further be exploited for calibration of the MRI system.

DETAILED DESCRIPTION

Figure 1:
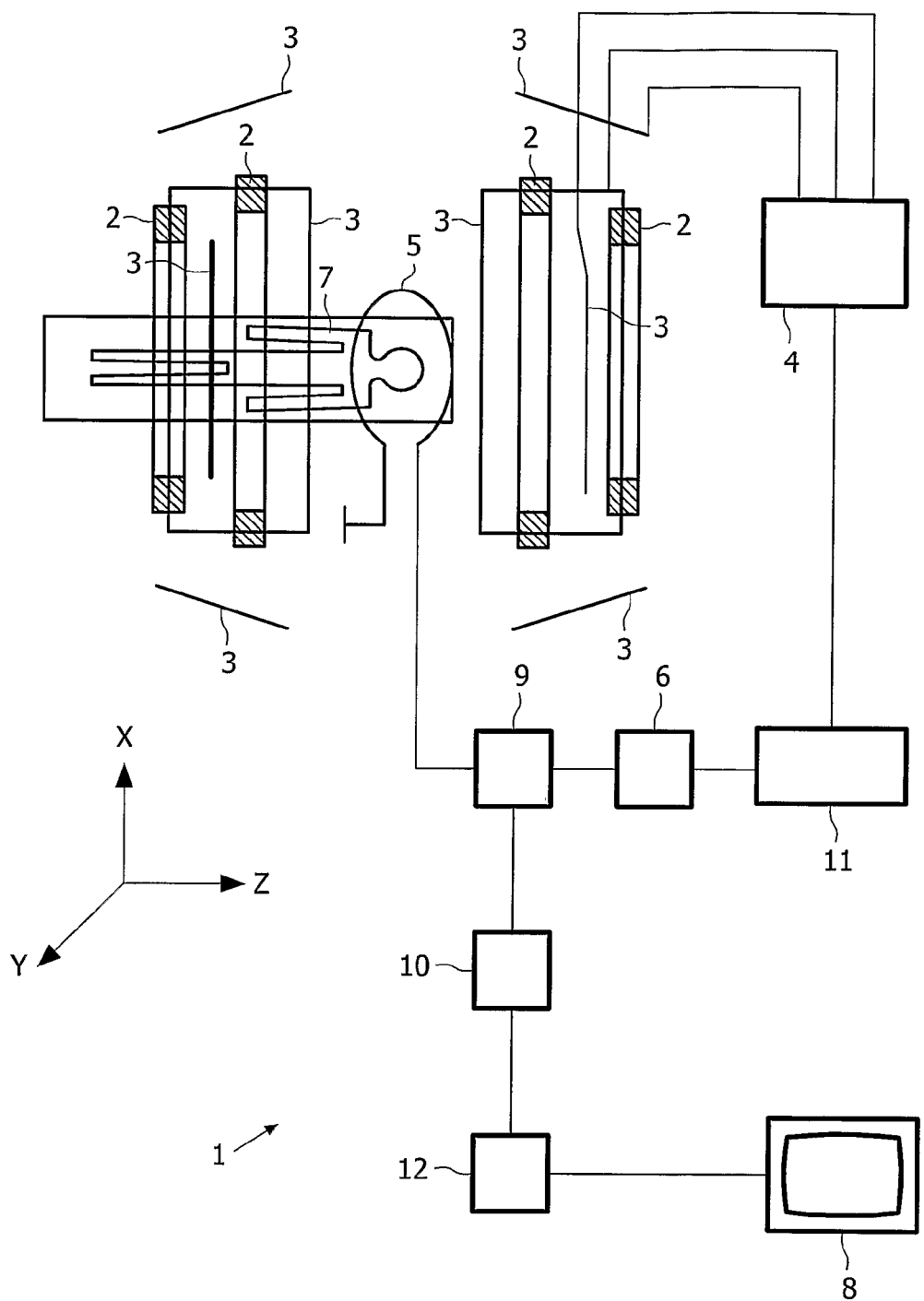
FIG. 1 shows a MRI system according to the prior art.

FIG. 1 shows a magnetic resonance imaging system 1 which includes a main magnet system 2 for generating a steady magnetic field, and also several gradient coils providing a gradient coil system 3 for generating additional magnetic fields having a gradient in the X, Y, Z directions. The Z direction of the coordinate system shown corresponds to the direction of the steady magnetic field in the main magnet system 2 by convention. The Z axis is an axis coaxial with the axis of a bore hole of the main magnet system 2, whereby the X axis is the vertical axis extending from the center of the magnetic field, and whereby the Y axis is the corresponding horizontal axis orthogonal to the Z axis and the X axis.

The gradient coils of the gradient coil system 3 are fed by a power supply unit 4. An RF transmitter coil 5 serves to generate RF magnetic fields and is connected to an RF transmitter and modulator 6.

A receiver coil is used to receive the magnetic resonance signal generated by the RF field in the object 7 to be examined, for example a human or animal body. This coil may be the same coil as the RF transmitter coil 5. Furthermore, the main magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9.

The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values so as to form an image by transformation. This image can be visualized, for example by means of a graphical user interface 8.

The operation of the processing unit 12, the control unit 11 as well as the graphical user interface 8 of the MRI system 1 is explained in greater detail below.

Figure 2:
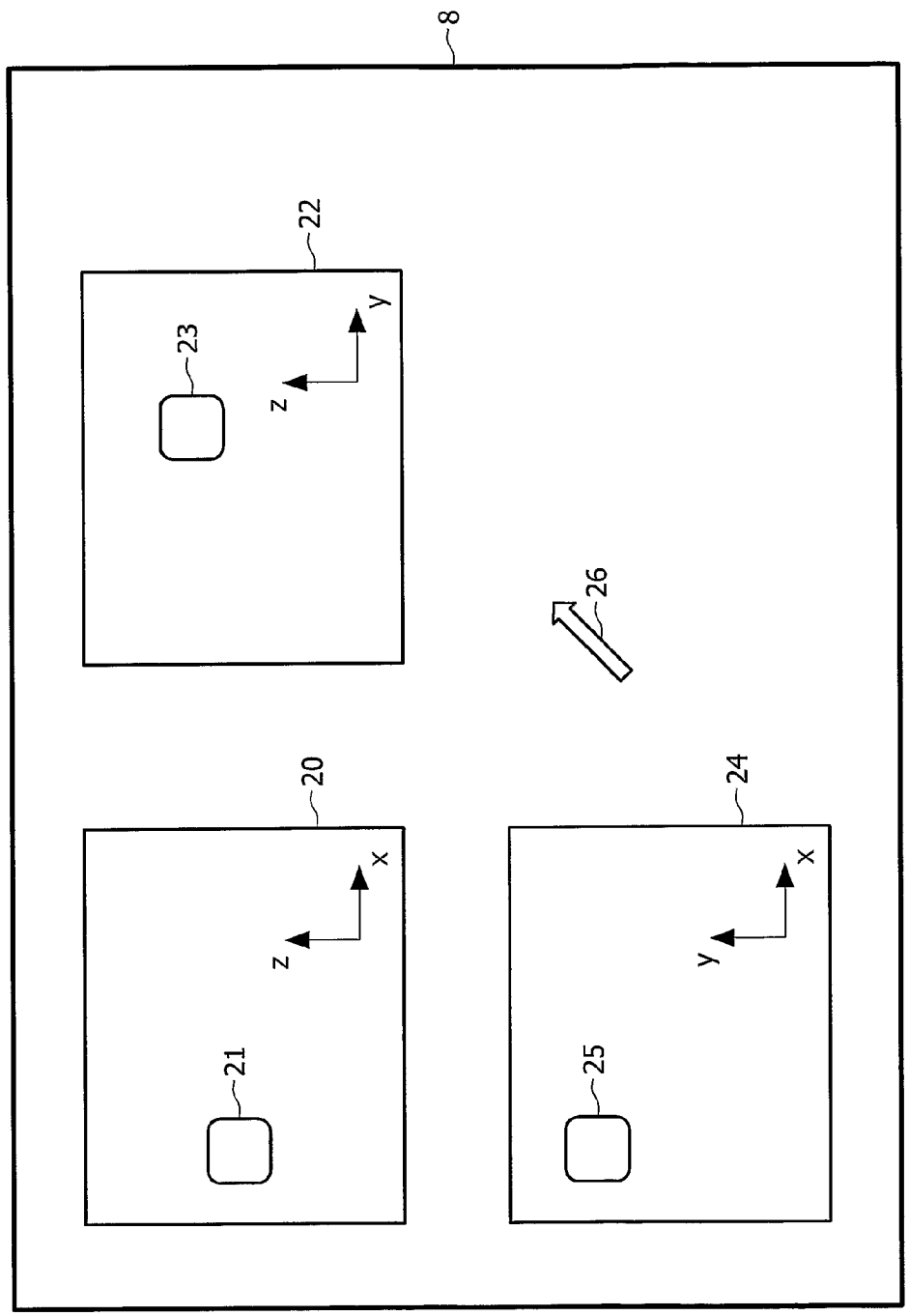
FIG. 2 shows a typical embodiment of the graphical user interface.

FIG. 2 shows a typical embodiment of the graphical user interface 8. The GUI 8 has three different windows 20, 22, 24, each of which illustrating a different slice of the three dimensional whole-body plan scan image obtained by a low resolution acquisition procedure of a patient. In illustrated embodiment the three windows 20, 22, 24 represent three mutually orthogonal slices through a patient body. The window 20 shows a slice in the Z-X plane, the window 22 shows a slice in the Z-Y plane and the window 24 shows a slice in the Y-X plane of the patient body. These mutually substantially orthogonal slices, also denoted as coronal, sagittal and axial, are only one way of illustration of a three dimensional body. Other, arbitrarily determined slices are also conceivable.

Within each window, i.e. each slice of the plan scan image, a region of interest can be specified. In the window 20 a region of interest 21 in window 22 a region of interest 23 and in window 24 a region of interest 25 can be specified by an operator making typically use of any kind of pointer 26 or similar input means. From the selected region of interest 21, 23, 25, the system then calculates a three dimensional region of interest which in the following becomes subject to high resolution imaging. In principle, the operator is free to indicate, that any one of the regions of interest 21, 23, 25 specifies the anatomy to be scanned, by simply placing the pointer 26 on a corresponding position within the displayed scout image.

When for example the MRI system makes effective use of pattern recognition means as well as determination of patient related positioning parameters, body parts being identified by the MRI system can further be labeled within the displayed scout image. The selection of regions of interest is not restricted to the use of a mouse pointer 26 but can alternatively be realized by means of voice control, anatomical touch sensitive map or even remote control handset.

Figure 3:
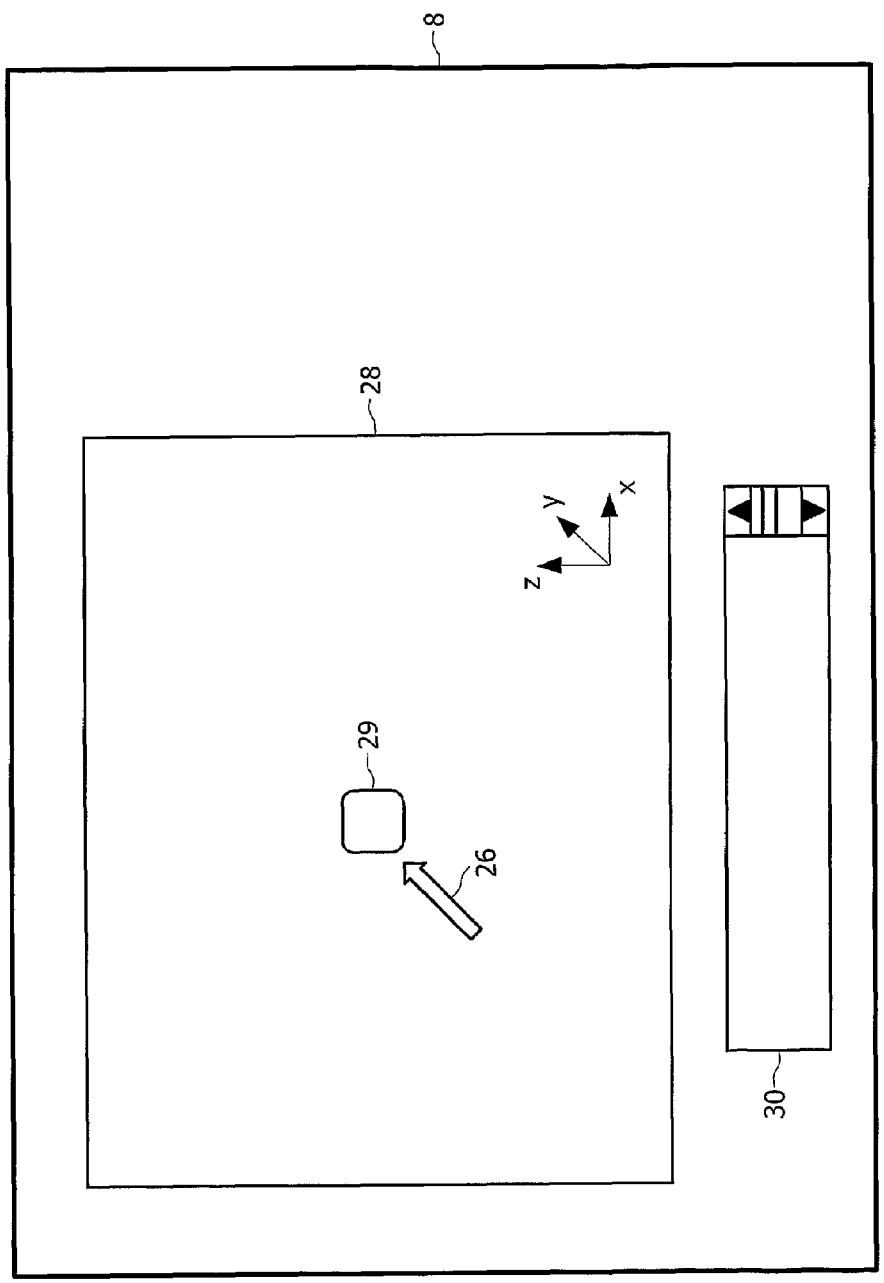
FIG. 3 shows an alternative embodiment of a graphical user interface.

FIG. 3 shows another embodiment of the GUI 8 only making use of a single window 28, that is adapted to provide a full three dimensional view of the plan scan image of the patient. Similarly as already described in FIG. 2, the operator can make use of a pointer 26 in order to determine and to select a region of interest 29. The GUI 8 also provides a body part selection window 30 providing a list of various body parts and/or organs of the body that have been autonomously identified and located by the MRI system. Identification and determination of the location of specific body parts and/or organs of the body makes use of extracting body positioning parameters from the acquired scout image being displayed by means of the window 28. The body positioning parameters are indicative of e.g. the size, the absolute or relative location, the orientation and the total mass of the body.

By means of correlating different slices of the three dimensional whole-body plan scan image in combination with a comparison of reference data and by making use of pattern recognition means, various body parts and/or organs of the body can precisely be identified and localized. The GUI is further adapted to provide the entire information that has been gathered from the whole-body plan scan image to the operator. The operator is then free to select a region of interest either by graphical interactive means or by specifying a body part or an organ of the body by making a selection of one of the body parts provided by the body part selection window 30. In this way, an operator can for example simply specify that a specific organ, e.g. the heart, becomes subject to magnetic resonance imaging. Making use of the whole-body plan scan image, the MRI system is capable to identify and to locate an organ and/or body part specified by the operator. In a next step, the system then individually adapts the acquisition parameters for the acquisition of a high resolution image of the designated organ.

The operator is by no means restricted to the GUI 8 illustrated by FIG. 2 and FIG. 3 but is enabled to individually specify the functionality and the appearance of the windows of the GUI 8. Moreover, the operator can make use of various image manipulation tools in order to rotate, translate, magnify, resize, etc. the visualized scout images.

Figure 4:
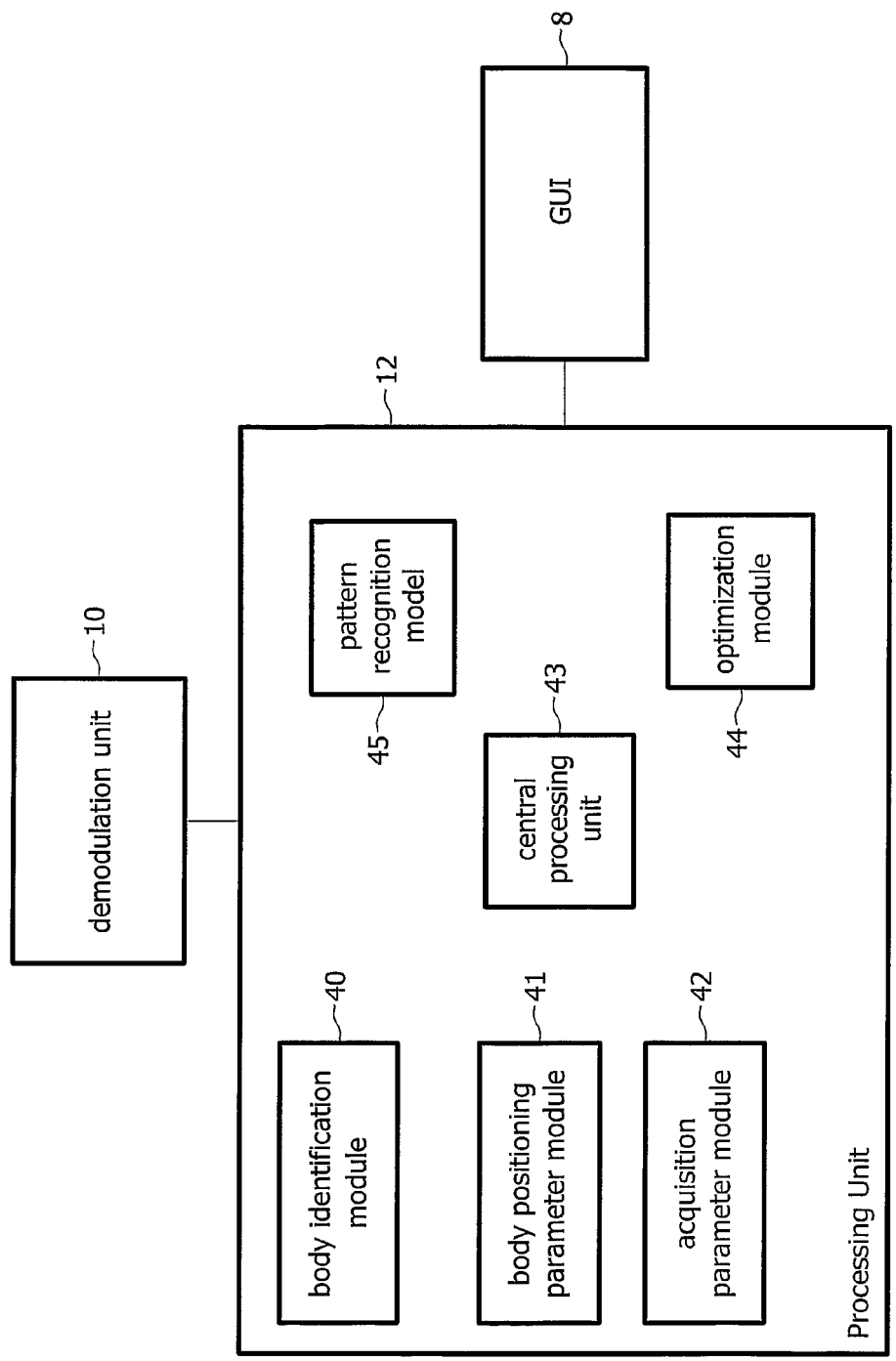
FIG. 4 shows a block diagram of the processing unit of the MRI system.

FIG. 4 shows a block diagram of the processing unit 12 that is connected to the signal amplifier 10 and the GUI 8. The processing unit 12 has a body identification module 40, a body positioning parameter module 41, an acquisition parameter module 42, a central processing unit 43, an optimization module 44 as well as a pattern recognition module 45. Phase and amplitude signals that are received from the transmission and reception unit 9 and that are amplified and demodulated by the demodulation unit 10 are inputted into the processing unit 12.

When the MRI system operates in a low resolution mode for acquiring the whole-body plan scan image of the body in a rapid way, the processing unit 12 processes the electrical phase and amplitude signals received from the demodulation unit 10 in such a way that the GUI 8 visualizes the low resolution whole-body plan scan image. A selection made by an operator in response to the visualization of the low resolution plan scan image is processed by the central processing unit 43. The processing unit 12 is adapted to transmit electrical signals to the control unit 11 in order to modify the RF transmission, the magnetic field gradients as well as the movement of the patient 7.

Electrical signals being transmitted to the processing unit 12 from the demodulation unit 10, that are indicative of the scout image of the patient are subject to further inspection by the body identification module 40, the body positioning parameter module 41, the acquisition parameter module 42, the central processing unit 43, the optimization module 44 and the pattern recognition module 45.

The body identification module 40 is adapted to process a selection made by an operator and provided by the GUI 8 to the processing unit 12. Processing of the selection means to identify the selection and to assign the selection to a relative or to an absolute position in the three dimensional space. A relative position typically refers to the position of the region of interest relative to a specific part of the body or relative to e.g. the main magnet system 2 or the RF transmitting coils 5 of the MRI system.

The body positioning parameter module 41 is adapted to extract relevant data of the patient on the basis of electrical signals being indicative of the scout image of the patient. By means of the body positioning parameter module 41, the MRI system is able to extract information of e.g. the size, the location, the orientation and the total mass of the patient. The results of this information extraction can also be stored for later use during subsequent high resolution scans and are also archived with the patient data.

The acquisition parameter module 42 is adapted to determine acquisition parameters for the acquisition of the high resolution image of the region of interest of the body. The acquisition parameters are determined by the acquisition parameter module 42 with respect to the body positioning parameters extracted, and previously stored, by the body positioning parameter module 42 and with respect to the assignment between identified body parts and the region of interest. The acquisition parameter module 42 is further adapted to interplay with the optimization module 44. The optimization module 44 performs optimization of e.g. gradient strength and RF transmission power with respect to the body positioning parameters, a body part or organ assigned to a region of interest and to the position of the patient 7 with respect to the location of the RF transmitter coil 5.

The pattern recognition module 45 is adapted to perform pattern recognition on the basis of the whole-body plan scan image. The pattern recognition module typically makes use of correlation techniques and is further adapted to compare image data obtained from the plan scan image with reference data stored in the pattern recognition module. In this way, the processing unit 12 is enabled to autonomously identify and to locate specific body parts and/or organs of the body on the basis of the low resolution whole-body plan scan image of the patient.

The central processing unit 43 of the processing unit 12 is adapted to control an interchange of data between the individual modules 40, 41, 42, 44 and 45 of the processing unit 12. The central processing unit 43 is further adapted to control the transmission of electrical signals between the processing unit 12 and the demodulation unit 10 as well as the data traffic between the processing unit 12 and the GUI 8.

Figure 5:
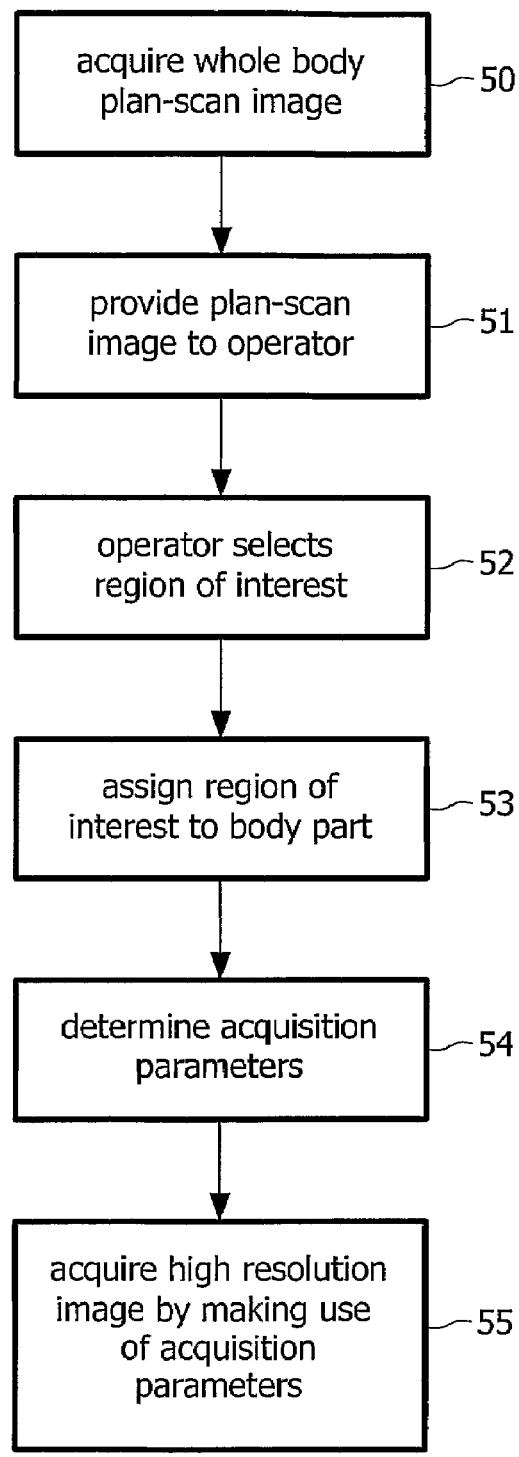
FIG. 5 is illustrative of a flowchart for acquisition of the whole-body plan scan image and the subsequent acquisition of the high resolution image of the region of interest.

FIG. 5 illustrates a flowchart of the method for acquisition of a whole-body plan scan image and the subsequent acquisition of a high resolution image. In the first step 50 the whole-body plan scan image is acquired. In the subsequent step 51 the plan scan image is provided to an operator making use of the GUI 8. In step 52 the operator selects a region of interest 21, 23, 25, 29 whereupon the MRI system moves the patient in such a position, that the region of interest of the body is within the region of optimum performance of the magnetic resonance imaging system 1.

Furthermore the selected region of interest is assigned to a body part in the successive step 53. This can effectively be done by exploiting previously extracted body positioning parameters that are indicative of e.g. the size, the position, the orientation and the total mass of the patient. Having knowledge of the positioning parameters of the patient as well as the assignment between the region of interest and a specific body part and/or organ of the patient, in step 54 corresponding acquisition parameters can be determined.

The acquisition parameters are preferably subject to optimization with respect to a specific absorption rate model and/or peripheral nerve stimulation model. This allows, that the strength of the static magnetic field as well as the power of the RF transmitting field are just below a maximum allowable value specified by SAR and/or PNS models. In this way, in step 55 a high resolution image can be acquired by making use of optimal acquisition parameters providing a high SNR of the final image and therefore a maximum image quality of the acquired high resolution image. Additionally, by providing the whole-body plan scan image to an operator, the selection of a region of interest is facilitated in an intuitive way. Moreover, a manual positioning of the patient is no longer required as well as a calibration of the MRI system can take place during acquisition of the whole-body plan scan image.

Figure 6:
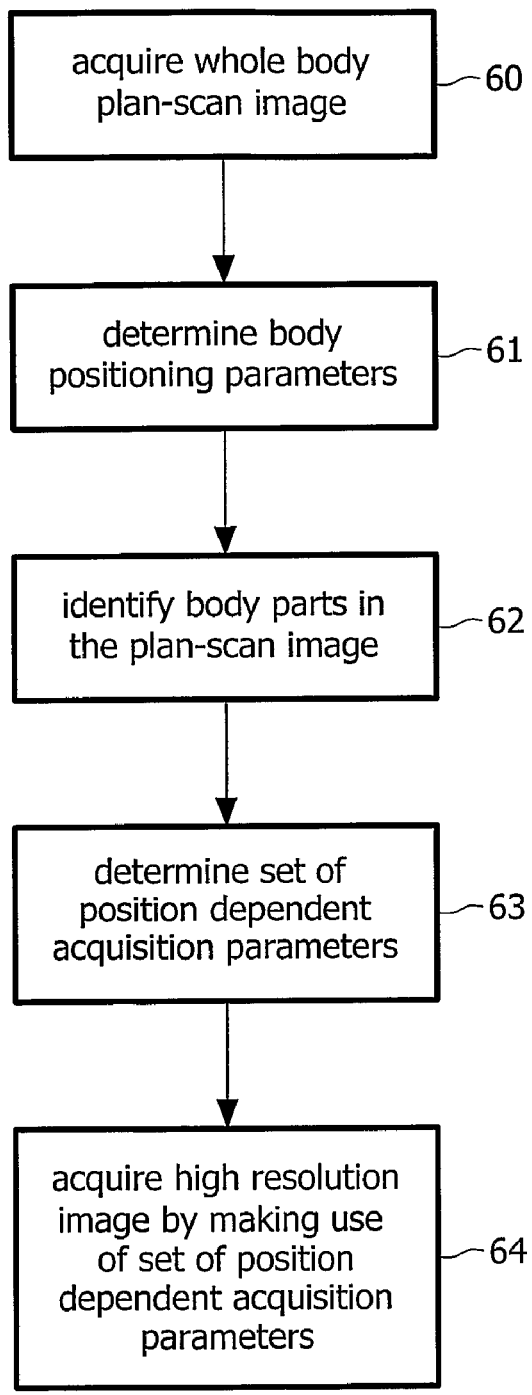
FIG. 6 illustrates a flowchart for optimization of the acquisition parameters.

FIG. 6 illustrates a flowchart for an optimization of acquisition parameters. In a first step 60, the whole-body plan scan image is acquired. Based on the acquired whole-body plan scan image body positioning parameters are determined in the successive step 61. Since the body positioning parameters are indicative of the size, the orientation, the location as well as of the mass of the patient, the MRI system compares these body positioning parameters with reference parameters in order to identify body parts of the patient in the plan scan image in step 62. In the following step 63, based on the identified body parts and based on the previously determined body positioning parameters, position dependent acquisition parameters are determined. This means, that the acquisition parameters are either statically or dynamically determined with respect to the body positioning parameters and with respect to the body part being in the region of optimum performance of the MRI system. Finally, in the last step 64 the high resolution image is acquired by making use of the determined acquisition parameters.

FIG. 6 illustrates a flowchart of a method for acquiring a high resolution image without interaction of an operator. Here, the method focuses on the optimization of acquisition parameters, that take into account the individual geometry and geometric data obtained from the whole-body plan scan image.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging system for acquiring a high resolution image of a region of interest of a body, the MRI system comprising:
   a scanning unit configured to acquire at least a low resolution whole-body plan scan image of the body and high resolution images of selectable regions of the body;
   a body identification module which autonomously identifies and locates the region of interest of the body in the whole-body plan scan image;
   an acquisition parameter module which determines dynamic acquisition parameters for a high resolution image on the basis of the identified and located region of interest; and
   a control unit configured to control the scanning unit to acquire the high resolution image of the identified region of interest using the determined acquisition parameters.

2. The system according to claim 1, further including:
   a graphical user interface for an operator's selection of the region of interest in the whole-body plan scan image.

3. The system according to claim 1, wherein:
   the scanning unit which acquires the high resolution image moves the location of the region of interest of the body to a region of optimum performance of an examination space of the magnetic resonance imaging system to acquire the high resolution image of the region of interest.

4. The system according to claim 1, further including:
   a body positioning parameter module which extracts body positioning parameters from the whole-body plan scan image, the body positioning parameters being indicative of an anatomy, a geometry, an orientation, and a mass of the body.

5. The system according to claim 4, wherein the acquisition parameter module dynamically determines the acquisition parameters with respect to the body positioning parameters and with respect to the region of interest being in the region of optimum performance of the examination space of the magnetic resonance imaging system.

6. The system according to claim 4, further including:
   pattern recognition module which autonomously identifies parts of the body on the basis of the whole-body plan scan image.

7. The system according to claim 1, wherein the body identification unit performs an assignment between the region of interest and a part of the body.

8. The system according to claim 7, wherein the acquisition parameter module determines the acquisition parameters with respect to the body positioning parameters and the assignment between the region of interest and a part of the body.

9. The system according to claim 1, wherein the determined acquisition parameters are subject to optimization with respect to a specific absorption rate model and/or peripheral nerve stimulation model.

10. The system according to claim 1, wherein the acquisition parameter module calibrates the magnetic resonance system on the basis of the whole body plan scan image.

11. A tangible computer readable medium which stores a program for controlling a magnetic resonance imaging system to acquire a high resolution image of a region of interest of a body, by performing the steps of:
   acquiring a low resolution whole-body plan scan image of the body;
   autonomously identifying and locating one or more regions of interest of the body in the whole-body plan scan image;
   determining dynamic acquisition parameters for the high resolution image on the basis of each identified and located region of interest; and
   acquiring the high resolution image of each identified region of interest using the determined acquisition parameters.

12. The tangible computer readable medium according to claim 11, wherein the steps further include:
   identifying a region of the whole body plan scan corresponding to a region of interest designated on a graphical user interface.

13. The tangible computer readable medium according to claim 11, wherein the step of acquiring the high resolution image further includes:
   moving the region of interest of the body into a region of optimum performance of the examination space of the magnetic resonance imaging system.

14. A method for acquiring a high resolution image of a region of interest of a body with a magnetic resonance imaging system, the method comprising:
   acquiring a low resolution whole-body plan scan image of the body;
   with a processor, autonomously identifying and locating the region of interest of the body in the low resolution whole-body plan scan image;
   with a processor, determining dynamic acquisition parameters for the high resolution image on the basis of the identified and located region of interest; and
   acquiring the high resolution image of the region of interest with the determined acquisition parameters.

15. The method according to claim 14, further including:
   extracting body positioning parameters from the whole-body plan scan image; and
   optimizing acquisition parameters for the high resolution image with respect to a specific absorption rate model and/or peripheral nerve stimulation model.

16. The method according to claim 14, further including calibrating the magnetic resonance system on the basis of the whole body plan scan image.

17. A diagnostic imaging system, comprising:
   a magnetic resonance (MR) scanner which uses selectable acquisition parameters to generate images with any of a plurality of properties;
   a graphical user interface by which an operator selects one or more regions of interest of a body;
   a control unit including a process programmed to:
      control the MR scanner to acquire a low resolution whole-body plan scan image of the body;
      receive the selected a region of interest from the graphical user interface;
      autonomously identify the selected region of interest in the whole body plan scan image;
      position the selected region of interest in an imaging region of the MR scanner;
      determine a relationship of the selected regions of interest relative to at least one part of the body;
      extract body positioning parameters from the whole-body plan scan image, the body positioning parameters being indicative of an anatomy, a geometry, an orientation, and a mass of the body;
      determine position dependent acquisition parameters for a high resolution image on the basis of the extracted body positioning parameters and the relationship of the regions of interest relative to an identified body part;
      optimize the determined acquisition parameters with respect to a specific absorption rate model and/or peripheral nerve stimulation model; and
      control the MR scanner to acquire the high resolution image of the region of interest using the optimized acquisition parameters.

* * * * *